United States Patent
Elaasar et al.

(10) Patent No.: US 12,395,126 B2
(45) Date of Patent: Aug. 19, 2025

(54) METHODS AND CIRCUITRY FOR REDUCING MIXER HARMONICS CONVERSION GAIN AND LOCAL OSCILLATOR FUNDAMENTAL AND HARMONICS FEEDTHROUGH

(71) Applicant: Apple Inc., Cupertino, CA (US)

(72) Inventors: Omar E Elaasar, San Diego, CA (US); Shan He, Austin, TX (US); Gang Zhang, Austin, TX (US); Anandaroop Chakrabarti, San Jose, CA (US)

(73) Assignee: Apple Inc., Cupertino, CA (US)

( * ) Notice: Subject to any disclaimer, the term of this patent is extended or adjusted under 35 U.S.C. 154(b) by 272 days.

(21) Appl. No.: 18/336,786

(22) Filed: Jun. 16, 2023

(65) Prior Publication Data

US 2024/0421769 A1    Dec. 19, 2024

(51) Int. Cl.
  *H03D 7/14* (2006.01)
  *H03M 1/66* (2006.01)
  *H03M 1/68* (2006.01)

(52) U.S. Cl.
  CPC ......... *H03D 7/1466* (2013.01); *H03D 7/1441* (2013.01); *H03D 7/1491* (2013.01); *H03D 2200/0052* (2013.01); *H03D 2200/0086* (2013.01); *H03M 1/66* (2013.01); *H03M 1/685* (2013.01)

(58) Field of Classification Search
  CPC .. H03D 7/1466; H03D 7/1441; H03D 7/1491; H03M 1/685; H03M 1/66
  See application file for complete search history.

(56) References Cited

U.S. PATENT DOCUMENTS

| | | |
|---|---|---|
| 6,819,914 B2 | 11/2004 | Yan et al. |
| 7,161,406 B1 | 1/2007 | Ferris |
| 8,099,070 B2 | 1/2012 | Mu et al. |
| 8,149,955 B2 | 4/2012 | Tired |
| 9,136,889 B2 | 9/2015 | Muhammad |
| 10,236,826 B1 | 3/2019 | Darwhekar et al. |
| 11,349,465 B2 | 5/2022 | Chakraborty |
| 2024/0162921 A1* | 5/2024 | Chakraborty ........ H04B 1/0028 |

* cited by examiner

*Primary Examiner* — Joseph J Lauture
(74) *Attorney, Agent, or Firm* — Treyz Law Group; Jason Tsai

(57) ABSTRACT

Mixer circuitry can include a first pair of transistors coupled to a first tail node and configured to receive a local oscillator signal, a second pair of transistors coupled to a second tail node and configured to receive the local oscillator signal, a first digital-to-analog converter, a second DAC coupled between the first DAC and of the first pair of transistors, and a third DAC coupled between the first DAC and the second pair of transistors. During a first phase, control circuitry can sweep the first DAC to trim a first and/or other odd order local oscillator feedthrough. During a second phase, the control circuitry can sweep the second DAC to trim a second and/or other even order local oscillator feedthrough. During a third phase, the control circuitry can sweep the second and third DACs to reject signals associated with a second harmonic conversion gain of the mixer circuitry.

20 Claims, 11 Drawing Sheets

METHODS AND CIRCUITRY FOR REDUCING MIXER HARMONICS CONVERSION GAIN AND LOCAL OSCILLATOR FUNDAMENTAL AND HARMONICS FEEDTHROUGH

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas that are used to transmit radio-frequency signals and receive radio-frequency signals.

The wireless communications circuitry can include a transceiver having one or more mixers. A mixer in the transmit path can be used to modulate signals from a baseband frequency to a radio frequency, whereas a mixer in the receive path can be used to demodulate signals from the radio-frequency to the baseband frequency. Mixers receive clock signals generated from local oscillator circuitry. It can be challenging to design satisfactory mixers and local oscillator circuitry for an electronic device.

SUMMARY

An electronic device may include wireless circuitry. The wireless circuitry may include one or more mixers that receive an oscillating signal. An oscillator can generate the oscillating signal, and oscillator driver circuitry can be used to convey the oscillating signal to the one or more mixers.

An aspect of the disclosure provides mixer circuitry that includes a first mixer transistor configured to receive a first oscillating signal and coupled to a first tail node, a second mixer transistor configured to receive a second oscillating signal and coupled to the first tail node, a first digital-to-analog converter (DAC), and a second digital-to-analog converter (DAC) coupled between the first DAC and the first mixer transistor. The second DAC can include a first output coupled to a gate terminal of the first mixer transistor and a second output coupled to a gate terminal of the second mixer transistor. The mixer circuitry can further include a third mixer transistor configured to receive the first oscillating signal and coupled to a second tail node, a fourth mixer transistor configured to receive the second oscillating signal and coupled to the second tail node, and a third digital-to-analog converter (DAC) coupled between the first DAC and the third mixer transistor. The first DAC can include a first output coupled to the second DAC and a second output coupled to the third DAC. The third DAC can include a first output coupled to a gate terminal of the third mixer transistor and a second output coupled to a gate terminal of the fourth mixer transistor. The mixer circuitry can further include control circuitry configured to trim the first DAC during a first calibration phase, to trim the second DAC during a second calibration phase subsequent to the first calibration phase, and to trim the second and third DACs during a third calibration phase subsequent to the second calibration phase.

An aspect of the disclosure provides mixer circuitry that includes a first pair of transistors coupled to a first tail node and having first gate terminals configured to receive a local oscillator signal, a second pair of transistors coupled to a second tail node and having second gate terminals configured to receive the local oscillator signal, a first digital-to-analog converter (DAC), a second digital-to-analog converter (DAC) coupled between the first DAC and the first gate terminals of the first pair of transistors, and a third digital-to-analog converter (DAC) coupled between the first DAC and the second gate terminals of the second pair of transistors. The mixer circuitry can include control circuitry configured to trim a direct current (DC) mismatch between the first tail node and the second tail node by adjusting the first DAC, to trim an impedance at the first tail node by adjusting the second DAC, and to trim a DC level of the local oscillator signal by adjusting the second DAC together with the third DAC.

An aspect of the disclosure provides a method of operating mixer circuitry that includes receiving a first oscillating signal at a gate terminal of a first mixer transistor, receiving a second oscillating signal at a gate terminal of a second mixer transistor, the first and second mixer transistors coupled to a first tail node, and using a second digital-to-analog converter (DAC) to receive a bias voltage from a first digital-to-analog converter (DAC), to output a first bias voltage to the gate terminal of the first mixer transistor, and to output a second bias voltage to the gate terminal of the second mixer transistor. The method can further include receiving the first oscillating signal at a gate terminal of a third mixer transistor, receiving the second oscillating signal at a gate terminal of a fourth mixer transistor, the third and fourth mixer transistors being coupled to a second tail node, and using a third digital-to-analog converter (DAC) to receive another bias voltage from the first digital-to-analog converter (DAC), to output a third bias voltage to the gate terminal of the third mixer transistor, and to output a fourth bias voltage to the gate terminal of the fourth mixer transistor.

The method can further include trimming an offset of the first DAC during a first phase, trimming an offset of the second DAC with respect to an offset of the third DAC during a second phase, and trimming the offset of the second DAC together with the offset of the third DAC during a third phase. During the first phase, a DC mismatch between the first tail node and the second tail node can be trimmed. During the second phase, the impedance at the first node with respect to the impedance at the second tail node can be trimmed. During the third phase, the DC level of the first oscillating signal with respect to the DC level of the second oscillating signal can be trimmed. During the first phase, the first DAC can be swept to trim a first order LO feedthrough. During the second phase, the second DAC can be swept to trim a second order LO feedthrough. During the third phase, the second and third DACs can be swept to reject signals associated with the second harmonic gain of the mixer circuitry.

DETAILED DESCRIPTION

Figure 1:
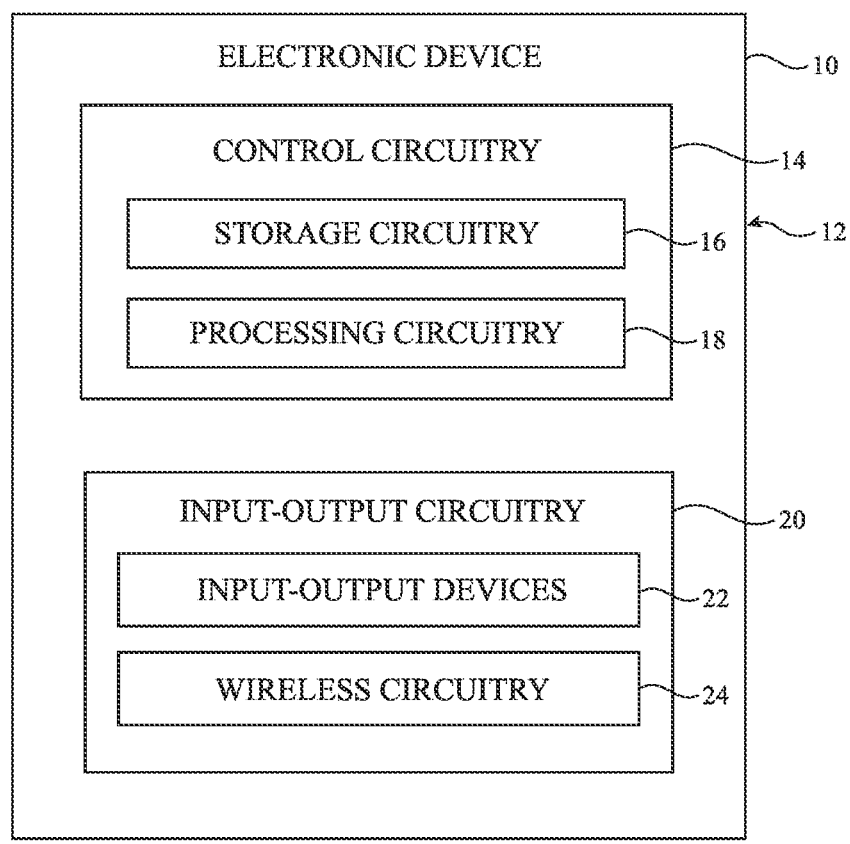
FIG. 1 is a diagram of an illustrative electronic device having wireless circuitry in accordance with some embodiments.

An electronic device such as electronic device 10 of FIG. 1 may be provided with wireless circuitry. The wireless circuitry may include one or more mixers such as a mixer in the transmit path for upconverting (modulating) signals from lower frequencies to higher frequencies and such as a mixer in the receive path for downconverting (demodulating) signals from higher frequencies to lower frequencies. A mixer can receive an oscillating (clock) signal from local oscillator circuitry. The local oscillator (LO) circuitry can exhibit non-linearities that produce a second harmonic component. The second harmonic component of the LO circuitry can mix with a block signal to interfere with in-band signals of interest at the output of the mixer. This effect is sometimes referred to collectively as the second harmonic conversion gain of the mixer.

A mixer can include four mixer transistors configured to receive LO signals. The first and second mixer transistors can have gates configured to receive a positive local oscillator signal LO+. The third and fourth mixer transistors can have gates configured to receive a negative local oscillator signal LO−. The four mixer transistors can have gates coupled to a group of at least three differential bias DACs such as DAC1, DAC2, and DAC3. DAC1 can have a first (+) output coupled to an input of DAC2 and a second (−) output coupled to an input of DAC3. DAC2 can have a first (+) output coupled to the gate of the first mixer transistor and a second (−) output coupled to the gate of the third mixer transistor. DAC3 can have a first (+) output coupled to the gate of the second mixer transistor and a second (−) output coupled to the gate of the fourth mixer transistor.

The three DACs can be trimmed to reduce undesired spurious emissions at the mixer circuitry. The trimming operations can include (1) calibrating an offset of DAC1 to trim a DC mismatch between a first tail node at the source terminals of the first and third mixer transistors and a second tail node at the source terminals of the second and fourth mixer transistors; (2) calibrating an offset of DAC2 with respect to the offset of DAC3 to trim an impedance at the first tail node with respect to the impedance at the second tail node at the fundamental and/or LO harmonic frequencies; and (3) calibrating an offset of DAC2 together with DAC3 to differentially trim LO+ relative to LO−. Operating the mixer circuitry in this way can be technically advantageous and beneficial due to at least the following results. Step (1) minimizes a first order LO feedthrough. Step (2) minimizes the $2^{nd}$ order LO feedthrough. Step (3) minimizes a (2LO−IF) blocker generated as a result of the mixer second harmonic conversion gain. In other words, undesired in-band spurs or spectral emissions can be suppressed.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
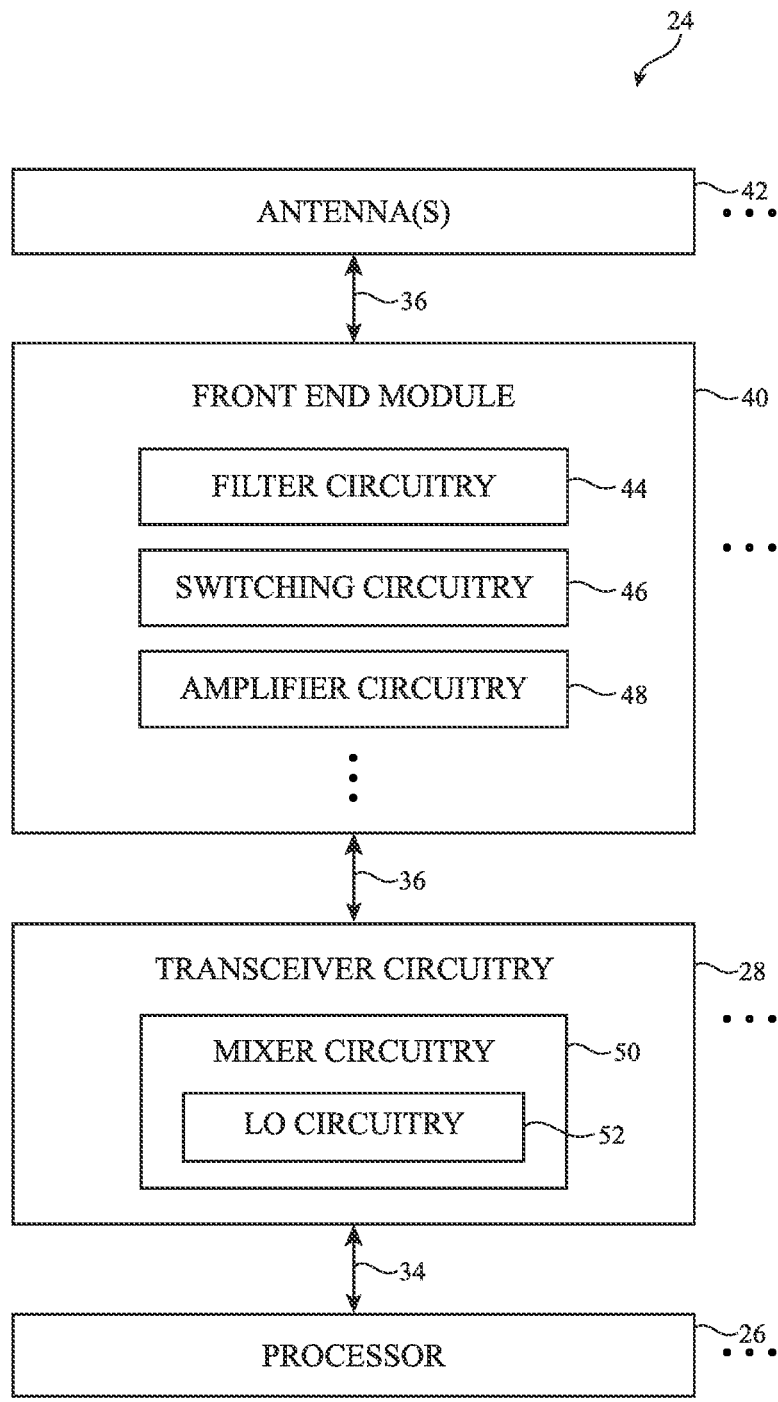
FIG. 2 is a diagram of illustrative wireless circuitry having transceiver circuitry in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for upconverting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40.

Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processor 26 over path 34. Mixer circuitry 50 can include local oscillator circuitry such as local oscillator (LO) circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies.

Figure 3A:
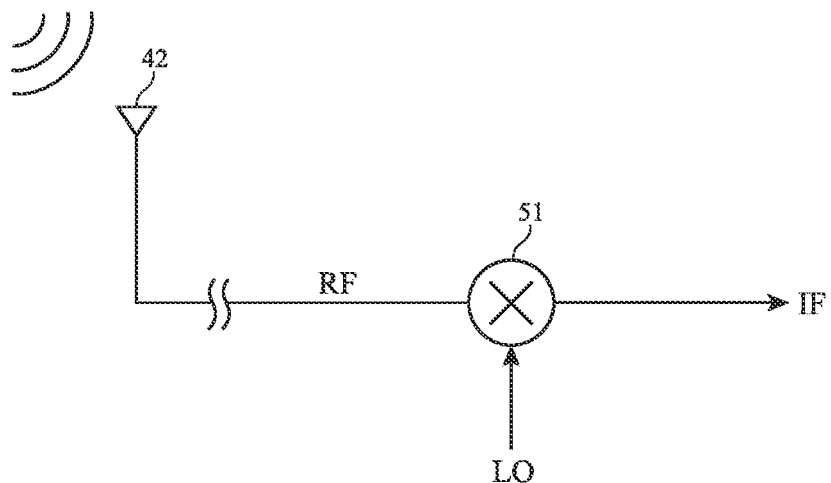
FIG. 3A is a diagram of an illustrative mixer in a receive path in accordance with some embodiments.

FIG. 3A is a diagram of an illustrative mixer in a receive (RX) path of the wireless circuitry. As shown in FIG. 3A, antenna 42 may feed received radio-frequency signals to mixer 51. Mixer 51 in the receive (downlink) path may be referred to as a receiving mixer. Mixer 51 may represent one or more receiving mixers in mixer circuitry 50 shown in FIG. 2. Mixer 51 may have a first input configured to receive a radio-frequency signal from antenna 42, a second input configured to receive an oscillating signal LO, and an output on which a demodulated signal that is downconverted to an intermediate frequency (IF) range is generated (as an example). One or more components such as a radio-frequency coupler, filter circuitry, antenna tuning element(s), matching network(s), switching circuitry, amplifier circuitry, other radio-frequency front end components, other transceiver components, and/or other wireless components can be disposed in the receive path between antenna 42 and mixer 51. Receiving mixer 51 that receives a radio-frequency signal can be referred to as a radio-frequency mixer.

Figure 3B:
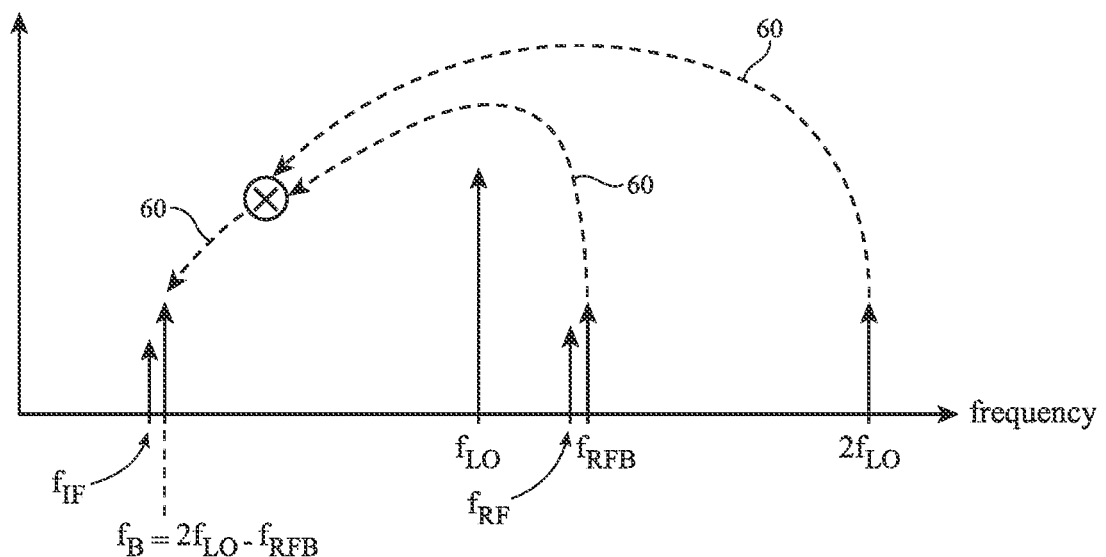
FIG. 3B is a diagram illustrating how a radio-frequency blocker can downconvert to an intermediate frequency of interest through a second harmonic conversion gain of a receiving mixer in accordance with some embodiments.

FIG. 3B is a diagram illustrating how a second harmonic conversion gain of mixer 51 can generate undesired in-band emissions at the mixer output if care is not taken. As shown in FIG. 3B, the radio-frequency signal received at the first input of mixer 51 can be located at frequency $f_{RF}$; adjacent channels or an in-band blocker can be located at $f_{RFB}$; the LO signal received at the second input of mixer 51 can be located at frequency $f_{LO}$; and the demodulated signal generated at the output of mixer 51 can be located at intermediate frequency $f_{IF}$. In practice, the local oscillator circuitry feeding the second input of mixer 51 can exhibit non-linear behavior that results in generation of a second harmonic component at frequency $2*f_{LO}$. Such second harmonic component can mix with the RF signal of an adjacent channel or an in-band blocker at $f_{RFB}$ and generate a downconverted blocker signal at frequency $f_B$, where blocker frequency $f_B$ is equal to $2*f_{LO}$ minus $f_{RFB}$ (see, e.g., arrows 60). This phenomenon is sometimes referred to as being caused by the second harmonic conversion gain of mixer 51.

The placement of the blocker frequency $f_B$ can be problematic if the selection of the radio-frequency $f_{RF}$ and the local oscillator frequency $f_{LO}$ results in a corresponding $f_B$ that is within or close to the intermediate frequency (IF) range of interest. For example, consider a scenario in which frequency $f_{RF}$ is equal to 37 GHz, frequency $f_{RFB}$ is equal to 38 GHz, and frequency $f_{LO}$ is equal to 25 GHz. The intermediate frequency $f_{IF}$ will be equal to 12 GHz (e.g., $f_{RF}-f_{LO}=37-25=12$ GHz). In this example, the downconverted blocker frequency $f_B$ will also be equal to 12 GHz (e.g., $2*f_{LO}-f_{RFB}=2*25-38=12$ GHz). In other words, the blocker signal at $f_B$ can interfere with the downconverted signal of interest at intermediate frequency $f_{IF}$ at the output of mixer 51, which can cause self-desense and degrade the overall signal-to-noise ratio of the receive path.

Figure 4A:
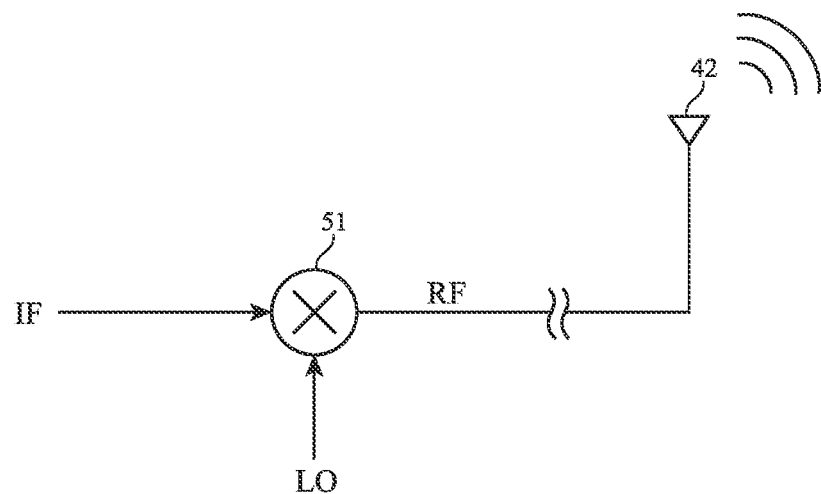
FIG. 4A is a diagram of an illustrative mixer in a transmit path in accordance with some embodiments.

FIG. 4A is a diagram of an illustrative mixer in a transmit (TX) path of the wireless circuitry. As shown in FIG. 4A, mixer 51 may output radio-frequency signals that are ultimately radiated by antenna 42. Mixer 51 in the transmit (uplink) path may be referred to as a transmitting mixer. Mixer 51 may represent one or more transmitting mixers in mixer circuitry 50 shown in FIG. 2. Transmitting mixer 51 may have a first input configured to receive a signal in the intermediate frequency (IF) range, a second input configured to receive an oscillating signal LO, and an output on which a modulated signal that is upconverted to a radio frequency (RF) range is generated (as an example). One or more components such as a radio-frequency coupler, filter circuitry, antenna tuning element(s), matching network(s), switching circuitry, amplifier circuitry, other radio-frequency front end components, other transceiver components, and/or other wireless components can be disposed in the transmit path between transmitting mixer 51 and antenna 42. Transmitting mixer 51 that outputs a radio-frequency signal can be referred to as a radio-frequency mixer.

Figure 4B:
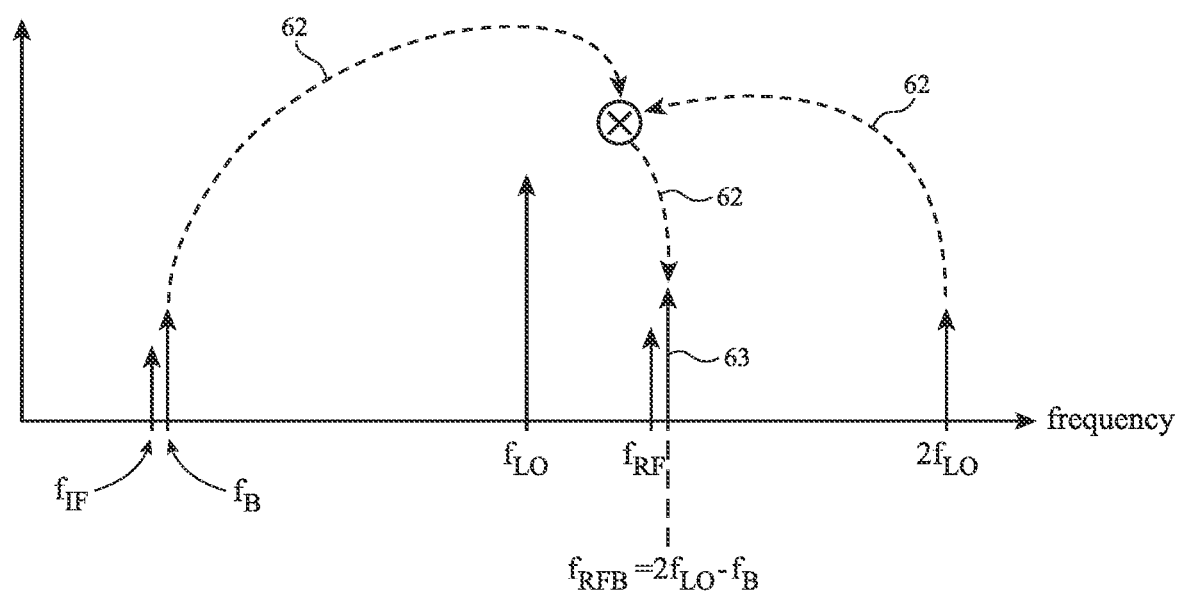
FIG. 4B is a diagram illustrating how a blocker signal at an intermediate frequency can upconvert to a radio-frequency range of interest through the second harmonic conversion gain of a transmitting mixer caused by a second harmonic component of local oscillator circuitry feeding the transmitting mixer in accordance with some embodiments.

FIG. 4B is a diagram illustrating how a second harmonic conversion gain of a transmitting mixer 51 can generate undesired in-band emissions at the mixer output if care is not taken. As shown in FIG. 4B, the intermediate frequency signal received at the first input of mixer 51 can be located at frequency $f_{IF}$; the LO signal received at the second input of mixer 51 can be located at frequency $f_{LO}$; and the modulated signal generated at the output of mixer 51 can be located at radio frequency $f_{RF}$. In practice, the local oscillator circuitry feeding the second input of transmitting mixer 51 can exhibit non-linear behavior that results in generation of a second harmonic component at frequency $2*f_{LO}$. Such second harmonic component can mix with an adjacent channel signal or in-band intermediate frequency blocker at $f_B$ and generate an upconverted interfering signal 63 that can fall in the radio-frequency range of interest (see, e.g., arrows 62 landing at frequency $f_{RFB}$, where $f_{RFB}$ is equal to $2*f_{LO}$ minus $f_B$). This phenomenon is sometimes referred to as being caused by the second harmonic conversion gain of mixer 51.

The frequency $f_{RFB}$ of the interfering signal 63 can be problematic if the selection of the radio-frequency $f_{RF}$ and the local oscillator frequency $f_{LO}$ results in the interfering signal falling within or close to the radio-frequency (RF) range of interest. For example, consider the scenario above in which frequency $f_{RF}$ is equal to 37 GHz and frequency $f_{LO}$ is equal to 25 GHz. The intermediate frequency $f_{IF}$ will be equal to 12 GHz (e.g., $f_{RF}-f_{LO}=37-25=12$ GHz). In this example, an in-band blocker at frequency $f_B$ equal to 13 GHz can also mix with $2*f_{LO}$ to recreate an upconverted interference signal 63 at frequency $f_{RFB}$ also at 37 GHz (e.g., $2*f_{LO}-f_B=2*25-13=37$ GHz). In other words, signal 63 can interfere with the radio-frequency signal of interest at $f_{RF}$ at the output of transmitting mixer 51, which can cause the transmit path to violate performance criteria.

Figure 5:
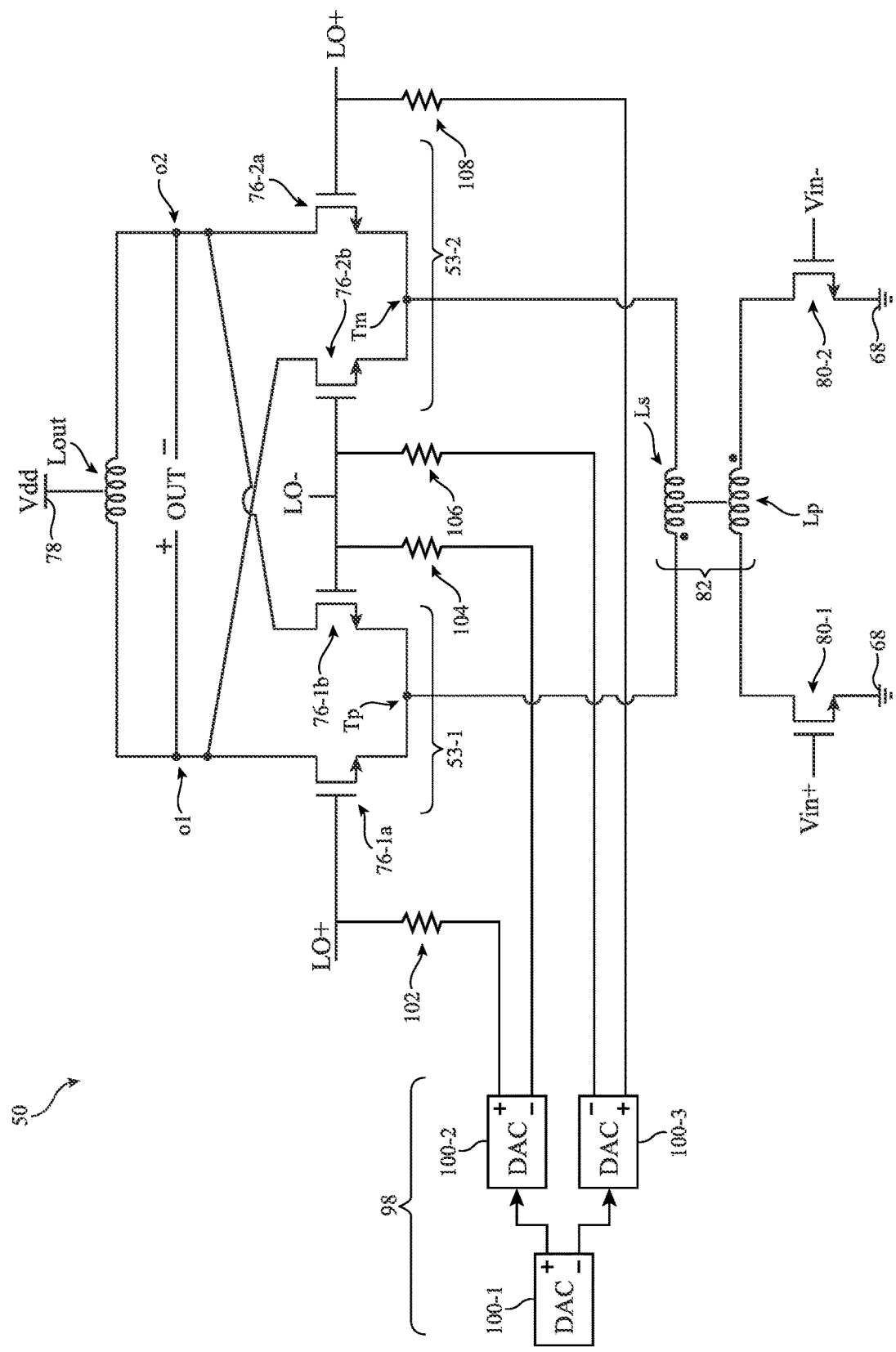
FIG. 5 is a diagram of illustrative mixer circuitry that includes a harmonic trimming circuit and a current reuse input transformer in accordance with some embodiments.

In accordance with an embodiment, mixer circuitry 50 is provided that includes a harmonic trimming circuit configured to reduce or suppress the various undesired spurious emissions described in connection with FIGS. 3B and 4B. FIG. 5 is a circuit diagram of illustrative mixer circuitry 50 that includes a harmonic trimming circuit such as harmonic trimming circuit 98. Mixer circuitry 50 can represent a transmitting mixer (e.g., a mixer in a transmit path) or a receiving mixer (e.g., a mixer in a receive path).

As shown in FIG. 5, mixer circuitry 50 may include a first input transistor 80-1 and a second input transistor 80-2 coupled to an input transformer such as transformer 82. Transformer 82 can include a primary coil (winding) Lp and a secondary coil (winding) Ls. Primary coil Lp can have a center tap that is shorted to the center tap of secondary coil Ls. Connecting together the center tap terminals of coils Lp and Ls in this way allows current to be shared or reused between the two coils. Transformer 82 configured in this way is therefore sometimes referred to as a "current reuse" transformer.

Input transistors 80-1 and 80-2 can be n-channel devices such as n-type metal-oxide-semiconductor (NMOS) transistors. Input transistor 80-1 may have a drain terminal coupled to a first terminal of coil Lp, a source terminal coupled to a ground power supply line 68 (e.g., a ground line on which a ground voltage is provided), and a gate terminal configured to receive input voltage Vin+. Input transistor 80-2 may have a drain terminal coupled to a second terminal of coil Lp, a source terminal coupled to ground line 68, and a gate terminal configured to receive input voltage Vin−. The delta of voltages Vin+ and Vin− may represent the differential radio-frequency input voltage of mixer circuitry 50. The terms "source" and "drain" terminals used to refer to current-conveying terminals in a transistor may be used interchangeably and are sometimes referred to as "source-drain" terminals. Thus, the drain terminal of transistor 80-1 can sometimes be referred to as a first source-drain terminal, and the source terminal of transistor 80-1 can be referred to as a second source-drain terminal (or vice versa).

Transformer 82 may be coupled to mixer subcircuits 53-1 and 53-2. Mixer subcircuit 53-1 can include a first pair of mixer transistors 76-1a and 76-1b (e.g., a first transistor pair). Mixer transistor 76-1a may have a source terminal coupled to secondary coil Ls, a gate terminal configured to receive signal LO+, and a drain terminal coupled to a first output terminal o1. Mixer transistor 76-1b may have a source terminal also coupled to secondary coil Ls, a gate terminal configured to receive signal LO−, and a drain terminal coupled to a second output terminal o2. The source terminals of mixer transistors 76-1a and 76-1b may be coupled to a first tail node Tp. Signals LO+ and LO− represent the positive and negative polarities of a differential signal and can collectively be referred to as a local oscillator signal or an oscillating signal. The gate terminals of mixer transistors 76-1a and 76-1b collectively form a differential input port for receiving the oscillating signal. Output terminals o1 and o2 collectively form the differential output port OUT of mixer circuitry 50. An output inductor Lout can be coupled across the differential output port of mixer circuitry 50. In particular, output inductor Lout may have a first terminal coupled to output terminal o1, a second terminal coupled to output terminal o2, and a center tap terminal coupled to a positive power supply line 78 (e.g., a positive power supply terminal on which positive power supply voltage Vdd is provided).

Mixer subcircuit 53-2 can include a second pair of mixer transistors 76-2a and 76-2b (e.g., a second transistor pair). Mixer transistor 76-2a may have a source terminal coupled to secondary coil Ls, a gate terminal configured to receive signal LO+, and a drain terminal coupled to the second output terminal o2. Mixer transistor 76-2b may have a source terminal also coupled to secondary coil Ls, a gate terminal configured to receive signal LO−, and a drain terminal coupled to the first output terminal o1. The source terminals of mixer transistors 76-2a and 76-2b may be coupled to a second tail node Tm. The gate terminals of mixer transistors 76-2a and 76-2b collectively form a differential input for receiving the oscillating signal.

To help reduce the undesired spurious emissions associated with the operation of mixer circuitry 50, the four mixer transistors (e.g., transistors 76-1a, 76-1b, 76-2a, and 76-2b) can be configured to receive bias voltages from harmonic trimming circuit 98. Harmonic trimming circuit 98 can include a plurality of differential direct current (DC) bias digital-to-analog converters such as a first DAC 100-1, a second DAC 100-2, and a third DAC 100-3. The first DAC 100-1 may have a first (positive) output coupled to second DAC 100-2 and may have a second (negative) output coupled to third DAC 100-3. The second DAC 100-2 may have a first (positive) output coupled to the gate terminal of mixer transistor 76-1a via resistor 102 and may have a second (negative) output coupled to the gate terminal of mixer transistor 76-1b via resistor 104. The third DAC 100-3 may have a first (positive) output coupled to the gate terminal of mixer transistor 76-2a via resistor 108 and may have a second (negative) output coupled to the gate terminal of mixer transistor 76-2b via resistor 106. These three DACs 100-1, 100-2, and 100-3 can be configured (calibrated or trimmed) to provide appropriate bias voltages to the gate terminals of the mixer transistors for optimal LO feedthrough reduction and harmonic gain rejection.

Figure 6:
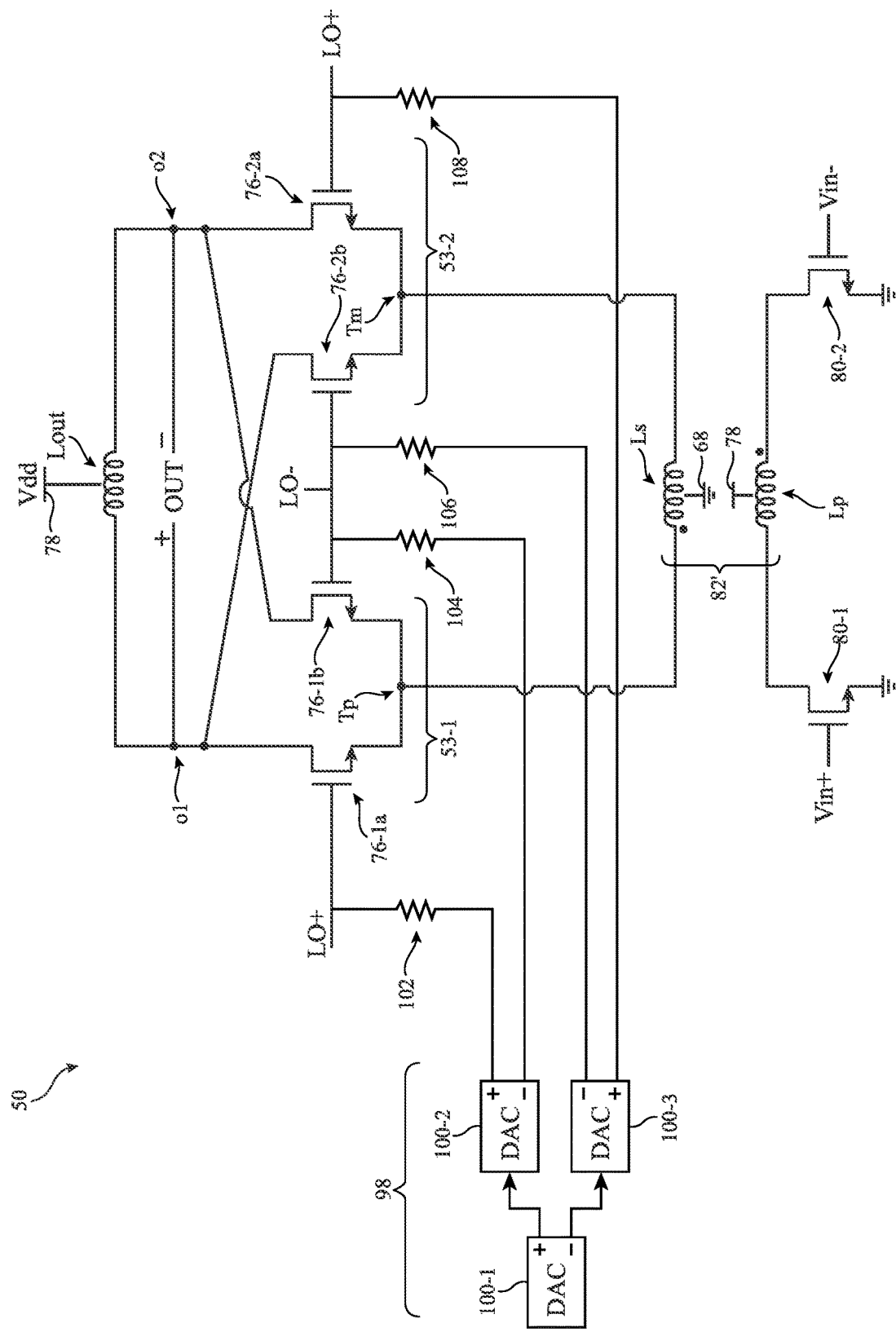
FIG. 6 is a diagram of illustrative mixer circuitry that includes a harmonic trimming circuit and an active input transformer in accordance with some embodiments.

The embodiment of FIG. 5 in which the input portion of mixer circuitry 50 is implemented using a current reuse transformer 82 is exemplary. FIG. 6 shows another embodiment of mixer circuitry 50 having an input portion that is implemented using an active transformer 82'. As shown in FIG. 6, transformer 82' includes a primary coil Lp with a center tap coupled to a power supply line such as positive power supply line 78. Transformer 82' also includes a secondary coil Ls with a center tap coupled to a power supply line such as ground line 68. This example where the center tap of coil Lp is coupled to power supply line 78 and where the center tap of coil Ls is coupled to ground line 68 is illustrative. As another example, the center tap of coil Lp can be coupled to ground line 68, whereas the center tap of coil Ls can be coupled to power supply line 78. As another example, the center tap of coils Lp and Ls can be coupled to different voltage lines. As another example, the center tap of coils Lp and Ls can be coupled to the same or different power supply lines.

Figure 7:
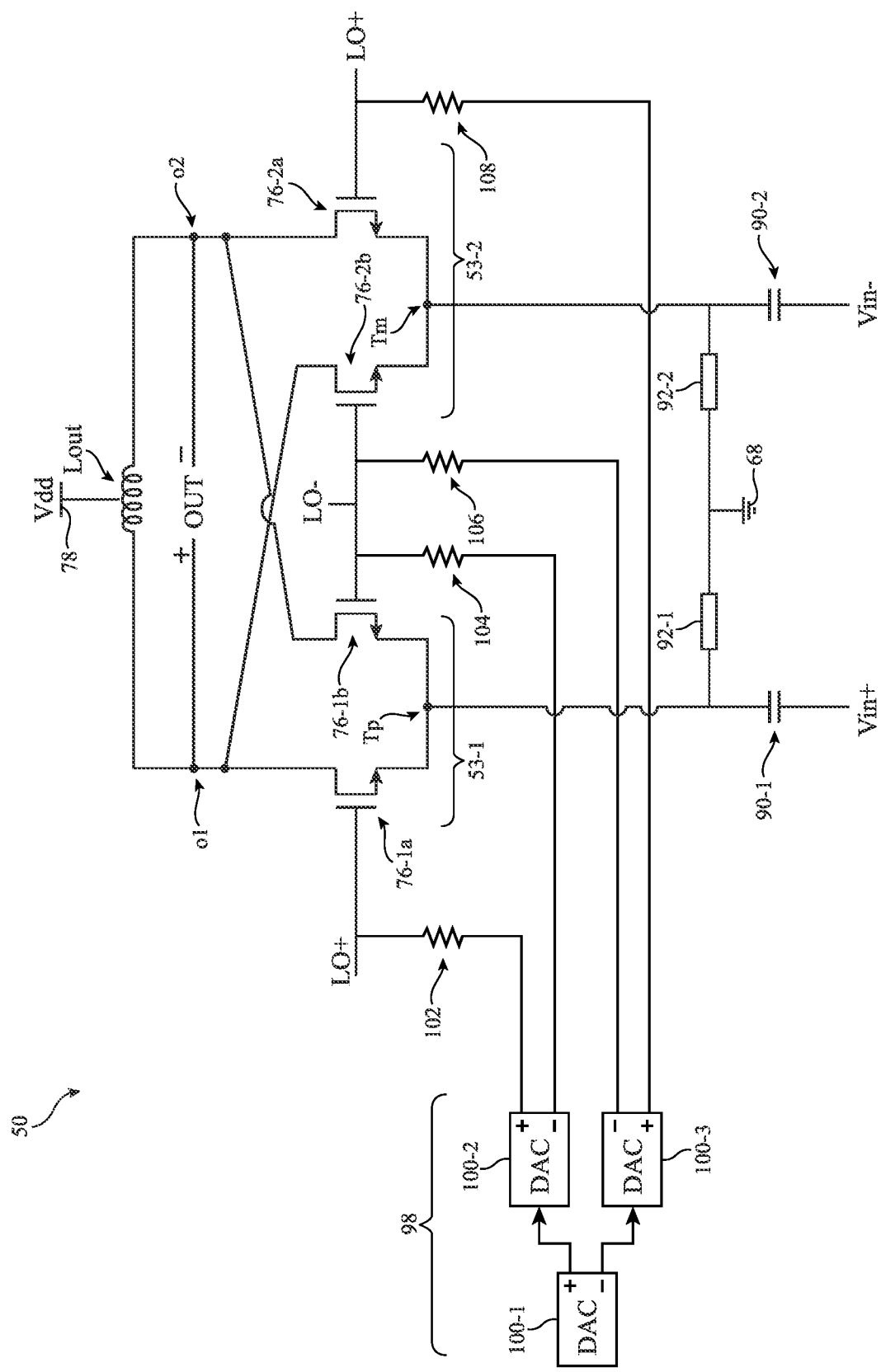
FIG. 7 is a diagram of illustrative mixer circuitry that includes a harmonic trimming circuit and a passive input in accordance with some embodiments.

The embodiment of FIG. 6 in which the input portion of mixer circuitry 50 is implemented using an active transformer 82' is exemplary. FIG. 7 shows another embodiment of mixer circuitry 50 having an input portion that is implemented using passive components. As shown in FIG. 7, the input portion of mixer circuitry 50 can include passive electrical components such as passive components 90-1, 90-2, 92-1, and 92-2. Component 90-1 (e.g., a first input coupling capacitor) may have a first terminal configured to receive input voltage Vin+ and a second terminal coupled to the first tail node Tp of mixer subcircuit 53-1. Component 90-2 (e.g., a second input coupling capacitor) may have a first terminal configured to receive input voltage Vin− and a second terminal coupled to the second tail node Tm of mixer subcircuit 53-2. Component 92-1 (e.g., a resistor, capacitor, inductor, or other passive load) may be coupled between capacitor 90-1 and ground line 68. Similarly, component 92-2 (e.g., a resistor, capacitor, inductor, or other passive load) may be coupled between capacitor 90-2 and ground line 68. The embodiment of FIG. 7 without any active input transistors (see, e.g., input transistors 80-1 and 80-2 in FIGS. 5 and 6, sometimes referred to collectively as a transconductance or "Gm" stage) is sometimes referred to as mixer circuitry 50 having a passive input stage. The embodiments of FIGS. 5-7 showing mixer circuitry 50 having various types of input stages are illustrative. If desired, mixer circuitry 50 can be implemented in other ways.

Figure 8:
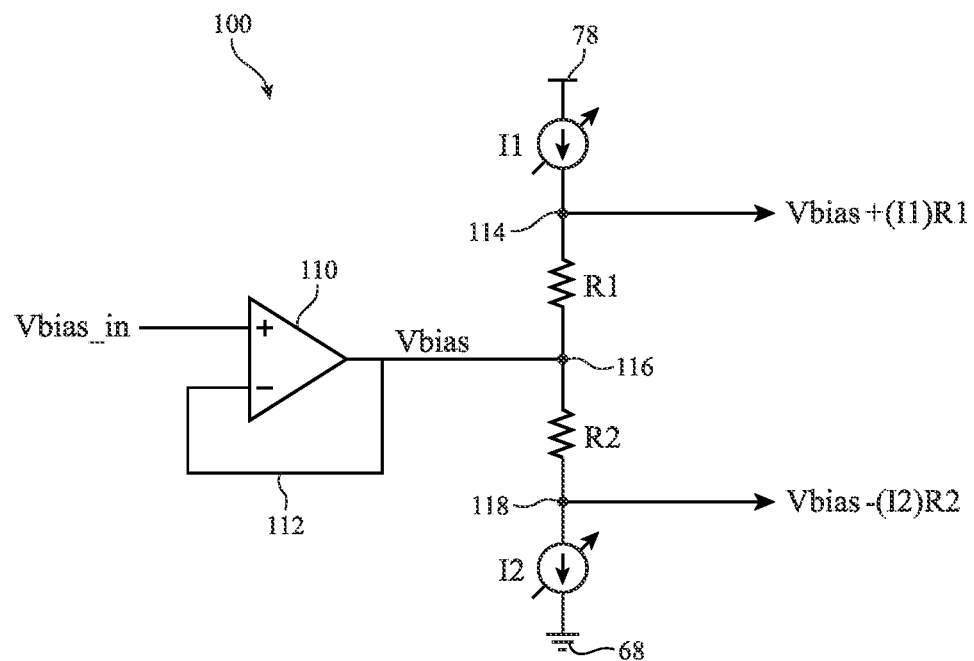
FIG. 8 is a circuit diagram showing one implementation of a differential bias digital-to-analog converter (DAC) in accordance with some embodiments.

The differential DC bias DACs 100 (e.g., DACS 100-1, 100-2, and 100-3) can be implemented in various ways. FIG. 8 is a circuit diagram showing one implementation of a DAC circuit 100. As shown in FIG. 8, DAC 100 may include a differential buffer such as buffer 110, resistors R1 and R2, and current sources I1 and I2. Buffer 110 may have a first (positive) input configured to receive an input bias voltage Vbias_in, a second (negative) input, and an output that is shorted to the second input via a feedback path 112. The input bias voltage Vbias_in can be fixed (static) or adjustable (tunable). Buffer 110 configured in this way is sometimes referred to as a "unity gain buffer" and can exhibit a gain of one. The output of buffer 110 is coupled to node 116. Bias voltage Vbias may be generated at node 116 and can have a voltage level that is equal to Vbias_in.

Resistor R1 may have a first terminal coupled to node 116 and a second terminal coupled to node 114. Current source I1 may have a first terminal coupled to positive power supply line 78 and a second terminal coupled to node 114. Current source I1 may be an adjustable current source (e.g., a current source with an adjustable amount of current such as a current source DAC). Resistor R2 may have a first terminal coupled to node 116 and a second terminal coupled to node 118. Resistors R1 and R2 can optionally have adjustable resistance. Current source I2 may have a first terminal coupled to node 118 and a second terminal coupled to ground line 68. Current source I2 may be an adjustable current sink (e.g., a current sink with an adjustable amount of current such as a current sink DAC). Configured in this way a first bias voltage that is equal to (Vbias+I1*R1) may be generated at first (positive) output node 114, whereas a second bias voltage that is equal to (Vbias −I2*R2) may be generated at second (negative) output node 118. The voltage level at output nodes 114 and 118 can be adjusted by tuning Vbias (e.g., by adjusting input bias voltage Vbias_in, by adjusting current I1 or I2, and/or by adjusting the resistance of R1 and R2.

Figure 9:
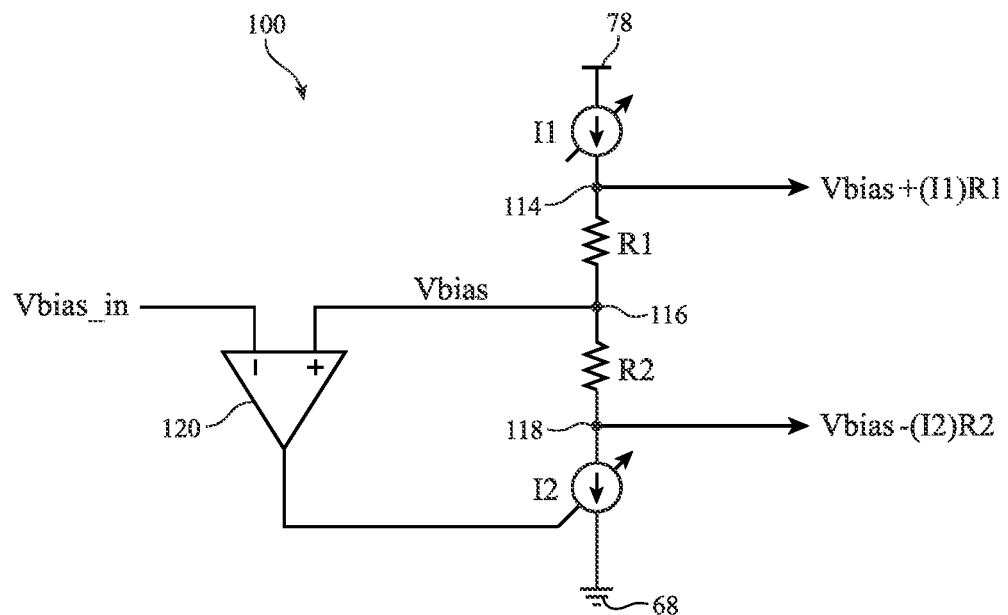
FIG. 9 is a circuit diagram showing another implementation of a differential bias digital-to-analog converter (DAC) in accordance with some embodiments.

FIG. 9 is a circuit diagram showing another implementation of a DAC circuit 100. As shown in FIG. 9, DAC 100 may include a differential buffer such as buffer 120, resistors R1 and R2, and current sources I1 and I2. Buffer 120 may have a first (negative) input configured to receive an input bias voltage Vbias_in, a second (positive) input coupled to node 116, and an output for controlling current source I2. The input bias voltage Vbias_in can be fixed (static) or adjustable (tunable). Bias voltage Vbias may be generated at node 116 and can have a voltage level that is equal to Vbias_in.

Resistor R1 may have a first terminal coupled to node 116 and a second terminal coupled to node 114. Current source I1 may have a first terminal coupled to positive power supply line 78 and a second terminal coupled to node 114. Current source I1 may be an adjustable current source (e.g., a current source with an adjustable amount of current such as a current source DAC). Resistor R2 may have a first terminal coupled to node 116 and a second terminal coupled to node 118. Resistors R1 and R2 can optionally have adjustable resistance. Current source I2 may have a first terminal coupled to node 118 and a second terminal coupled to ground line 68. Current source I2 may be an adjustable current sink (e.g., a current sink with an adjustable amount of current such as a current sink DAC). Configured in this way a first bias voltage that is equal to (Vbias+I1*R1) may be generated at first (positive) output node 114, whereas a second bias voltage that is equal to (Vbias −I2*R2) may be generated at second (negative) output node 118. The voltage level at output nodes 114 and 118 can be adjusted by tuning Vbias (e.g., by adjusting input bias voltage Vbias_in, by adjusting current I1 or I2, and/or by adjusting the resistance of R1 and R2. The embodiments of FIGS. 8 and 9 are exemplary. In general, the mixer circuitry can be provided with differential bias DACs having any suitable DAC architecture.

Figure 10:
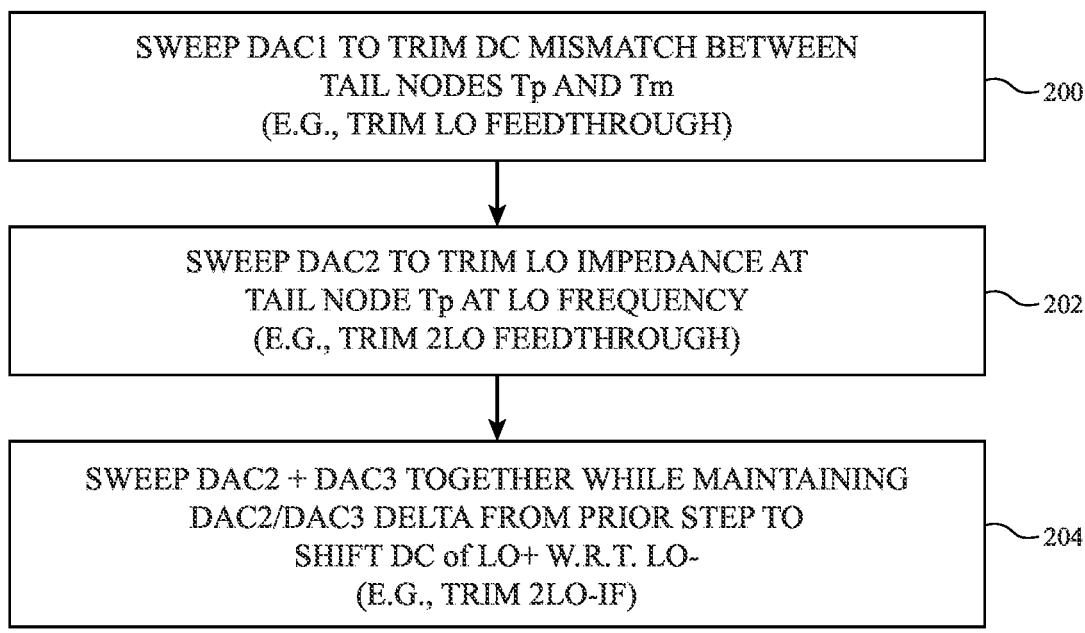
FIG. 10 is a flow chart of illustrative steps for operating mixer circuitry of the types shown in FIGS. 5-7 in accordance with some embodiments.

FIG. 10 is a flow chart of illustrative steps for operating mixer circuitry 50 of the types shown in FIGS. 5-7 in accordance with some embodiments. During the operations of block 200, the first DAC 100-1 (sometimes referred to and defined herein as "DAC1") can be swept to trim or minimize the DC mismatch between the tail nodes Tp and Tm. DAC1 can be swept by adjusting the current sources I1 and I2 (see, e.g., FIGS. 8 and 9) so that the voltages at the two output nodes are adjusted over its tuning range. DAC1 calibrates the DC current flowing into tail node Tp and Tm, which has around 1:1 relationship with the first order LO feedthrough and third order LO feedthrough (and in general, other higher order odd LO feedthroughs). Trimming DAC1 in this way can establish a establish a DC offset for DAC1 (referred to and defined herein as "OS1") that calibrates or minimizes the first order and other higher odd order LO feedthroughs. Block 200 is sometimes referred to as a first calibration phase.

During the operations of block 202, the second DAC 100-2 (sometimes referred to and defined herein as "DAC2") can be swept to trim the LO impedance at tail node Tp with respect to the impedance at tail node Tm at the LO frequency. The signal at the LO frequency upconverts to the differential mode $2^{nd}$ harmonic frequency through the fundamental mixer gain, so trimming DAC2 can be used to trim the $2^{nd}$ harmonic ("2LO") feedthrough. Trimming DAC2, however, does not impact the amount of DC current flowing to tail node Tp and therefore does not impact the LO feedthrough trimming of block 202. Thus, the operations of block 202 can be said to be orthogonal or independent of the operations of block 200. Trimming DAC2 in this way can establish a delta between the DC offset of DAC2 (referred to and defined herein as "OS2") and the DC offset of DAC3 (referred to and defined herein as "OS3") that calibrates or minimizes the 2LO feedthrough. Block 202 is sometimes referred to as a second calibration phase.

During the operations of block 204, DAC2 and the third DAC 100-3 (sometimes referred to and defined herein as "DAC3") can be swept together (i.e., in parallel in the same direction) while maintaining the DC offset delta established from block 202 to shift the DC level of signal LO+ with respect the DC level of signal LO−. Sweeping DAC2 in tandem with DAC3 can move the OS2 and the DC offset of DAC3 (referred to and defined herein as "OS3") in the same direction, which can help minimize IF (intermediate frequency) feedthrough and also any blocker signal component at (2LO −IF). Trimming DAC2+DAC3 together, however, does not impact the DC offset delta established during block 204. Thus, the operations of block 204 can be said to be orthogonal to the operations of block 202. Trimming DAC2 and DAC3 in this way to minimize the (2LO −IF) blocker signal can therefore be said to calibrate or minimize the mixer second harmonic conversion gain. DAC1, DAC2, and DAC3 are therefore sometimes referred to collectively as a harmonic rejection circuit 98. These various DACs can be trimmed, adjusted, or calibrated using control circuitry 14 (see FIG. 1), processing circuitry 18, logic, or other controller. Block 204 is sometimes referred to as a third calibration phase.

The operations of FIG. 10 are illustrative. In some embodiments, DAC2 can be set equal to DAC3 and the two can be trimmed together to individually trim the (2LO −IF) component. In other embodiments, DAC3 can be set to zero and DAC2 alone can be trimmed to minimize the 2LO feedthrough component. If desired, the operations of block 202 can be performed before block 200. If desired, the operations of block 204 can be performed before block 202 or before block 200. In some embodiments, one or more of the described operations may be modified, replaced, or omitted. In some embodiments, one or more of the described operations may be performed in parallel. In some embodiments, additional processes may be added or inserted between the described operations. If desired, the order of certain operations may be reversed or altered and/or the timing of the described operations may be adjusted so that they occur at slightly different times.

Figure 11:
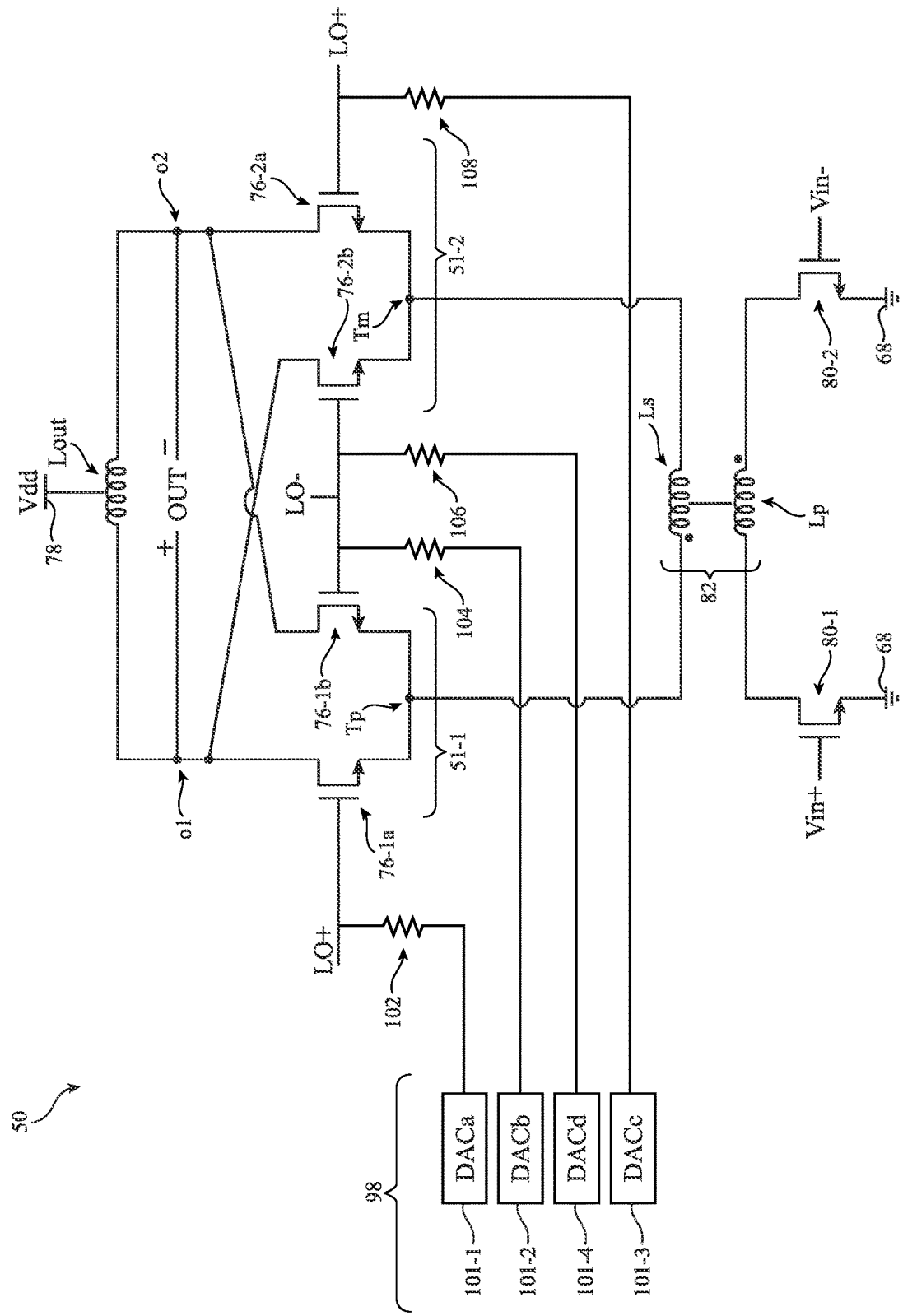
FIG. 11 is a diagram of illustrative mixer circuitry that includes a harmonic trimming circuit with four single-ended bias DACs in accordance with some embodiments.

The embodiments of FIGS. 5-7 where mixer circuitry 50 is provided with a harmonic rejection circuit 98 that includes three DACs are exemplary. FIG. 11 shows another embodiment of mixer circuitry 50 that includes a harmonic rejection circuit 98 having four single-ended DC bias DACs. As shown in FIG. 11, harmonic rejection circuit 98 can include a first DAC 101-1 (sometimes referred to herein as "DACa"), a second DAC 101-2 (sometimes referred to herein as "DACb"), a third DAC 101-3 (sometimes referred to herein as "DACc"), and a fourth DAC 101-4 (sometimes referred to herein as "DACd"). The first DACa may have an output coupled to the gate terminal of mixer transistor 76-1a via resistor 102. The second DACb may have an output coupled to the gate terminal of mixer transistor 76-1b via resistor 104. The third DACc may have an output coupled to the gate terminal of mixer transistor 76-2a via resistor 108. The fourth DACd may have an output coupled to the gate terminal of mixer transistor 76-2b via resistor 106. These four DACs can be configured (trimmed or calibrated) to provide appropriate bias voltages to the gate terminals of the mixer transistors for optimal harmonic gain rejection. The offset associated with DACa may be referred to as "OSa"; the offset associated with DACb may be referred to as "OSb"; the offset associated with DACc may be referred to as "OSc"; and the offset associated with DACd may be referred to as "OSd".

Mixer circuitry 50 of FIG. 11 includes a current reuse transformer 82. This is exemplary. As another example, mixer circuitry 50 of FIG. 11 might employ an active transformer 82' (see, e.g., active input transformer 82' of FIG. 6). As another example, mixer circuitry 50 of FIG. 11 might employ a passive input stage (see, e.g., passive mixer input stage of FIG. 7). In general, mixer circuitry 50 having any type of input stage can be employed.

Figure 12:
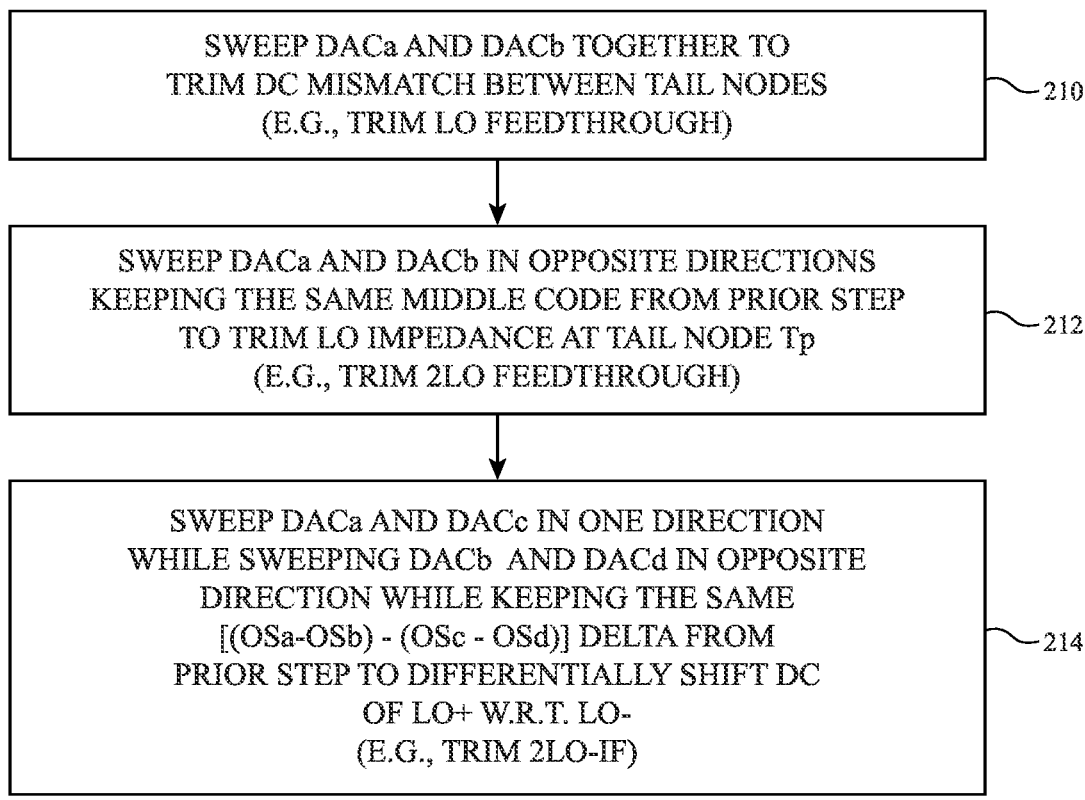
FIG. 12 is a flow chart of illustrative steps for operating mixer circuitry of the type shown in FIG. 11 in accordance with some embodiments.

FIG. 12 is a flow chart of illustrative steps for operating mixer circuitry 50 of the type shown in FIG. 11. During the operations of block 210, DACa and DACb can be swept together (e.g., OSa and OSb can be swept in the same direction) to trim or minimize the DC mismatch between the tail nodes Tp and Tm. Trimming DACa in tandem with DACb while keeping DACc and DACd fixed in this way can tune OSa and OSb with respect to OSc and OSd to calibrate or minimize the first order and other higher odd order LO feedthroughs.

During the operations of block 212, DACa and DACb may be swept in opposite directions while keeping the same middle code from block 212 to trim the LO impedance at tail node Tp at the LO frequency. The signal at the LO frequency upconverts to the differential mode $2^{nd}$ harmonic frequency through the fundamental mixer gain, so trimming DACa and DACb can be used to trim the $2^{nd}$ harmonic ("2LO") feedthrough. Trimming DACa and DACb in opposing directions in this way can tune the delta of (OSa with respect to OSb) and (OSc with respect to OSd) to calibrate or minimize the 2LO feedthrough. The operations of block 212 can be said to be orthogonal or independent of the operations of block 210.

During the operations of block 214, DACa and DACc can be swept in a first direction while DACb and DACd can be swept in a second (opposing) direction while keeping the same offset delta established from block 212 to shift the DC level of signal LO+ with respect the DC level of signal LO−. This can help minimize IF (intermediate frequency) feedthrough in a transmitting mixer where the input signal is at the IF band, RF feedthrough in a receiving mixer where the input signal is at the RF band, and also any blocker signal component at (2LO −IF). The operations of block 214 can be said to be orthogonal to the operations of block 212. Trimming the DACs in this way to minimize the (2LO −IF) blocker signal can therefore be said to calibrate or minimize the mixer second harmonic conversion gain. These various DACs can be trimmed, adjusted, or calibrated using control circuitry 14 (see FIG. 1), processing circuitry 18, logic, or other controller.

The operations of FIG. 12 are illustrative. In some embodiments, DAC1 can be set equal to DAC3 while DAC2 can be set equal to DAC4 and these DACs can be trimmed to minimize the (2LO −IF) component. In other embodiments, DAC3 can be set equal to DAC4 while DAC1 can be swept opposite to DAC2 to trim the 2LO feedthrough component. If desired, the operations of block 212 can be performed before block 210. If desired, the operations of block 214 can be performed before block 212 or before block 210. In some embodiments, one or more of the described operations may be modified, replaced, or omitted. In some embodiments, one or more of the described operations may be performed in parallel. In some embodiments, additional processes may be added or inserted between the described operations. If desired, the order of certain operations may be reversed or altered and/or the timing of the described operations may be adjusted so that they occur at slightly different times.

The methods and operations described above in connection with FIGS. 1-12 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

What is claimed is:

1. Mixer circuitry comprising:
  a first mixer transistor configured to receive a first oscillating signal and coupled to a first tail node;
  a second mixer transistor configured to receive a second oscillating signal and coupled to the first tail node;
  a first digital-to-analog converter (DAC); and
  a second digital-to-analog converter (DAC) coupled between the first DAC and the first mixer transistor.

2. The mixer circuitry of claim 1, wherein the second DAC comprises:
  a first output coupled to a gate terminal of the first mixer transistor; and
  a second output coupled to a gate terminal of the second mixer transistor.

3. The mixer circuitry of claim 2, further comprising:
  a first resistor coupled between the first output of the second DAC and the gate terminal of the first mixer transistor; and
  a second resistor coupled between the second output of the second DAC and the gate terminal of the second mixer transistor.

4. The mixer circuitry of claim 1, further comprising:
  a third mixer transistor configured to receive the first oscillating signal and coupled to a second tail node;
  a fourth mixer transistor configured to receive the second oscillating signal and coupled to the second tail node; and
  a third digital-to-analog converter (DAC) coupled between the first DAC and the third mixer transistor.

5. The mixer circuitry of claim 4, wherein the first DAC comprises:
  a first output coupled to the second DAC; and
  a second output coupled to the third DAC.

6. The mixer circuitry of claim 4, wherein the third DAC comprises:
  a first output coupled to a gate terminal of the third mixer transistor; and
  a second output coupled to a gate terminal of the fourth mixer transistor.

7. The mixer circuitry of claim 6, further comprising:
  a first resistor coupled between the first output of the third DAC and the gate terminal of the third mixer transistor; and
  a second resistor coupled between the second output of the third DAC and the gate terminal of the fourth mixer transistor.

8. The mixer circuitry of claim 4, further comprising:
  a transformer coupled to the first and second tail nodes.

9. The mixer circuitry of claim 4, wherein:
  the first mixer transistor has a drain terminal coupled to a first mixer output;
  the second mixer transistor has a drain terminal coupled to a second mixer output;
  the third mixer transistor has a drain terminal coupled to the first mixer output; and
  the fourth mixer transistor has a drain terminal coupled to the second mixer output.

10. The mixer circuitry of claim 4, further comprising control circuitry configured to:
  trim the first DAC during a first calibration phase;
  trim the second DAC during a second calibration phase subsequent to the first calibration phase; and
  trim the second and third DACs during a third calibration phase subsequent to the second calibration phase.

11. Mixer circuitry comprising:
  a first pair of transistors coupled to a first tail node and having first gate terminals configured to receive a local oscillator signal;
  a second pair of transistors coupled to a second tail node and having second gate terminals configured to receive the local oscillator signal;
  a first digital-to-analog converter (DAC);
  a second digital-to-analog converter (DAC) coupled between the first DAC and the first gate terminals of the first pair of transistors; and
  a third digital-to-analog converter (DAC) coupled between the first DAC and the second gate terminals of the second pair of transistors.

12. The mixer circuitry of claim 11, further comprising:
  a coil having a first terminal coupled to the first tail node and having a second terminal coupled to the second tail node.

13. The mixer circuitry of claim 11, wherein the first DAC comprises:
  a first output coupled to the second DAC; and
  a second output coupled to the third DAC.

14. The mixer circuitry of claim 11, further comprising control circuitry configured to:
  tune the first DAC during a first calibration phase;
  tune the second DAC during a second calibration phase subsequent to the first calibration phase; and
  tune the second and third DACs during a third calibration phase subsequent to the second calibration phase.

15. The mixer circuitry of claim 11, further comprising control circuitry configured to:
  trim a direct current (DC) mismatch between the first tail node and the second tail node by adjusting the first DAC;
  trim an impedance at the first tail node by adjusting the second DAC; and
  trim a DC level of the local oscillator signal by adjusting the second DAC together with the third DAC.

16. A method of operating mixer circuitry, comprising:
  receiving a first oscillating signal at a gate terminal of a first mixer transistor;
  receiving a second oscillating signal at a gate terminal of a second mixer transistor, the first and second mixer transistors coupled to a first tail node; and
  with a second digital-to-analog converter (DAC), receiving a bias voltage from a first digital-to-analog converter (DAC), outputting a first bias voltage to the gate terminal of the first mixer transistor, and outputting a second bias voltage to the gate terminal of the second mixer transistor.

17. The method of claim 16, further comprising:
receiving the first oscillating signal at a gate terminal of a third mixer transistor;
receiving the second oscillating signal at a gate terminal of a fourth mixer transistor, the third and fourth mixer transistors coupled to a second tail node; and
with a third digital-to-analog converter (DAC), receiving another bias voltage from the first digital-to-analog converter (DAC), outputting a third bias voltage to the gate terminal of the third mixer transistor, and outputting a fourth bias voltage to the gate terminal of the fourth mixer transistor.

18. The method of claim 17, further comprising:
during a first phase, trimming an offset of the first DAC;
during a second phase different than the first phase, trimming an offset of the second DAC with respect to an offset of the third DAC; and
during a third phase different than the second phase, trimming the offset of the second DAC together with the offset of the third DAC.

19. The method of claim 17, further comprising:
during a first phase, trimming a direct current (DC) mismatch between the first tail node and the second tail node;
during a second phase different than the first phase, trimming an impedance at the first tail node with respect to an impedance at the second tail node; and
during a third phase different than the second phase, trimming a DC level of the first oscillating signal with respect to a DC level of the second oscillating signal.

20. The method of claim 17, further comprising:
during a first phase, sweeping the first DAC to trim a first order local oscillator feedthrough;
during a second phase different than the first phase, sweeping the second DAC to trim a second order local oscillator feedthrough; and
during a third phase different than the second phase, sweeping the second and third DACs to reject signals associated with a second harmonic gain of the mixer circuitry.

* * * * *